United States Patent
Nagaoka et al.

(10) Patent No.: US 11,270,882 B2
(45) Date of Patent: *Mar. 8, 2022

(54) FILM FORMATION APPARATUS CONFIGURED TO SUPPLY MIST OF A SOLUTION TO SURFACE OF A SUBSTRATE AND METHOD OF MANUFACTURING SEMICONDUCTOR DEVICE USING THE FILM FORMATION APPARATUS

(71) Applicants: Tatsuji Nagaoka, Nagakute (JP); Hiroyuki Nishinaka, Kyoto (JP); Daisuke Tahara, Kyoto (JP); Masahiro Yoshimoto, Kyoto (JP)

(72) Inventors: Tatsuji Nagaoka, Nagakute (JP); Hiroyuki Nishinaka, Kyoto (JP); Daisuke Tahara, Kyoto (JP); Masahiro Yoshimoto, Kyoto (JP)

(73) Assignees: DENSO CORPORATION, Kariya (JP); NATIONAL UNIVERSITY CORPORATION KYOTO INSTITUTE OF TECHNOLOGY, Kyoto (JP)

(*) Notice: Subject to any disclaimer, the term of this patent is extended or adjusted under 35 U.S.C. 154(b) by 31 days.

This patent is subject to a terminal disclaimer.

(21) Appl. No.: 16/741,060

(22) Filed: Jan. 13, 2020

(65) Prior Publication Data
US 2020/0243333 A1 Jul. 30, 2020

(30) Foreign Application Priority Data
Jan. 25, 2019 (JP) .............................. JP2019-011144

(51) Int. Cl.
*H01L 21/02* (2006.01)
*B05B 17/06* (2006.01)

(52) U.S. Cl.
CPC .... *H01L 21/02628* (2013.01); *B05B 17/0653* (2013.01); *H01L 21/02565* (2013.01)

(58) Field of Classification Search
CPC ......... H01L 21/02565; H01L 21/02628; B05B 17/0653
See application file for complete search history.

(56) References Cited

U.S. PATENT DOCUMENTS

| | | | | |
|---|---|---|---|---|
| 2003/0072817 A1* | 4/2003 | Aoki | .......................... | A23F 5/26 424/725 |
| 2015/0279944 A1* | 10/2015 | Hitora | ............... | H01L 21/02565 257/43 |
| 2020/0376515 A1* | 12/2020 | Nagaoka | ........... | H01L 21/02565 |

FOREIGN PATENT DOCUMENTS

JP    2015-070248 A    4/2015

OTHER PUBLICATIONS

Song Hui, "Chinese Fire Protection Dictionary", Liaoning People's Publishing House, Jul. 31, 1992, p. 235 (6 pages total).

* cited by examiner

*Primary Examiner* — Quoc D Hoang
(74) *Attorney, Agent, or Firm* — Sughrue Mion, PLLC

(57) ABSTRACT

A film formation apparatus is configured to supply mist of a solution to a surface of a substrate so as to epitaxially grow a film on the surface of the substrate. The film formation apparatus may be provided with: a furnace configured to house and heat the substrate; a reservoir configured to store the solution; a heater configured to heat the solution in the reservoir; an ultrasonic transducer configured to apply ultrasound to the solution in the reservoir so as to generate the mist of the solution in the reservoir; and a mist supply path configured to carry the mist from the reservoir to the furnace.

9 Claims, 2 Drawing Sheets

FILM FORMATION APPARATUS CONFIGURED TO SUPPLY MIST OF A SOLUTION TO SURFACE OF A SUBSTRATE AND METHOD OF MANUFACTURING SEMICONDUCTOR DEVICE USING THE FILM FORMATION APPARATUS

CROSS-REFERENCE TO RELATED APPLICATION

This application claims priority to Japanese Patent Application No. 2019-011144 filed on Jan. 25, 2019, the contents of which are hereby incorporated by reference into the present application.

TECHNICAL FIELD

The technology disclosed herein relates to a film formation apparatus and a method of manufacturing a semiconductor device.

BACKGROUND

Japanese Patent Application Publication No. 2015-070248 describes a film formation apparatus configured to supply mist of a solution to a surface of a substrate so as to grow a film on the surface of the substrate. This film formation apparatus includes a furnace, a reservoir, an ultrasonic transducer, and a mist supply path. The furnace houses and heats the substrate. The reservoir stores the solution therein. The ultrasonic transducer applies ultrasound to the solution in the reservoir so as to generate the mist of the solution in the reservoir. The mist supply path carries the mist from the reservoir to the furnace. The mist adheres to the surface of the substrate in the furnace, by which the film is grown on the surface of the substrate.

SUMMARY

The technology in Japanese Patent Application Publication No. 2015-070248 has difficulty in efficiently generating the mist of the solution when generating the mist in the reservoir. The present specification proposes a technology that enables efficient generation of mist in a reservoir.

A film formation apparatus disclosed herein is configured to supply mist of a solution to a surface of a substrate so as to epitaxially grow a film on the surface of the substrate. The film formation apparatus may comprise: a furnace configured to house and heat the substrate; a reservoir configured to store the solution; a heater configured to heat the solution in the reservoir; an ultrasonic transducer configured to apply ultrasound to the solution in the reservoir so as to generate the mist of the solution in the reservoir; and a mist supply path configured to carry the mist from the reservoir to the furnace.

The heater may be of any type so long as the heater can heat the solution in the reservoir. For example, the heater may be a heater using electrically heated wire or may be one that heats the solution through heat exchange with a heated liquid.

This film formation apparatus is capable of heating the solution in the reservoir by the heater while applying ultrasound to the solution in the reservoir by the ultrasonic transducer. Heating the solution while applying the ultrasound to the solution enables efficient generation of the mist from the solution. Therefore, this film formation apparatus enables a film to be grown suitably on a surface of a substrate.

DETAILED DESCRIPTION

First Embodiment

Figure 1:
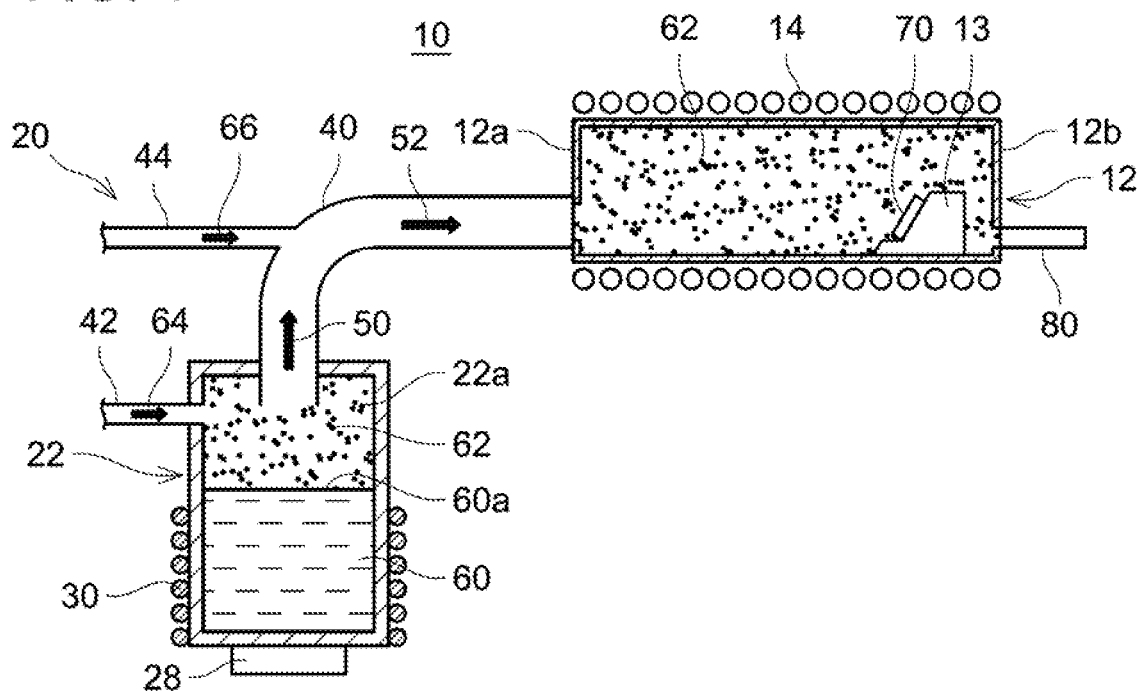
FIG. 1 is a configuration diagram of a film formation apparatus in a first embodiment.

A film formation apparatus 10 shown in FIG. 1 is an apparatus configured to epitaxially grow a film on a surface of a substrate 70. The film formation apparatus 10 comprises a furnace 12 configured to allow the substrate 70 to be placed therein, a heater 14 configured to heat the furnace 12, a mist supply device 20 connected to the furnace 12, and an exhaust pipe 80 connected to the furnace 12.

A specific configuration of the furnace 12 is not limited to particular one. Although this is merely an example, the furnace 12 shown in FIG. 1 is a tubular furnace extending from an upstream end 12a to a downstream end 12b. The furnace 12 has a circular cross section perpendicular to its longitudinal direction. Here, the cross section of the furnace 12 is not limited to circular one.

The mist supply device 20 is connected to the upstream end 12a of the furnace 12. The downstream end 12b of the furnace 12 is connected to the exhaust pipe 80. The mist supply device 20 is configured to supply mist 62 into the furnace 12. The mist 62 that has been supplied into the furnace 12 by the mist supply device 20 flows through the furnace 12 to the downstream end 12b, and is then discharged to an outside of the furnace 12 via the exhaust pipe 80.

A substrate stage 13 for supporting the substrate 70 is provided in the furnace 12. The substrate stage 13 is configured such that the substrate 70 is inclined with respect to the longitudinal direction of the furnace 12. The substrate 70 supported by the substrate stage 13 is supported in an orientation that allows the mist 62 flowing through the furnace 12 from the upstream end 12a toward the downstream end 12b to be applied to a surface of the substrate 70.

As mentioned above, the heater 14 is configured to heat the furnace 12. A specific configuration of the heater 14 is not limited to particular one. Although this is merely an example, the heater 14 shown in FIG. 1 is a heater using electrically heated wire, and is disposed along a peripheral wall of the furnace 12. The heater 14 heats the peripheral wall of the furnace 12, by which the substrate 70 in the furnace 12 is heated.

The mist supply device 20 includes a reservoir 22, another heater 30, and an ultrasonic transducer 28.

The reservoir 22 is an enclosed container. The reservoir 22 stores solution 60 containing a raw material of a film which is to be epitaxially grown on the surface of the substrate 70. For example, if a gallium oxide ($Ga_2O_3$) film is to be epitaxially grown, a solution in which gallium is dissolved can be used as the solution 60. Moreover, the solution 60 may have a raw material for adding an n-type or p-type dopant to the gallium oxide film (e.g., ammonium fluoride) further dissolved therein. Moreover, the solution 60 may contain hydrochloric acid. A space 22a is provided between a surface 60a of the solution 60 and an upper surface of the reservoir 22.

The ultrasonic transducer 28 is installed at a bottom surface of the reservoir 22. The ultrasonic transducer 28 is configured to apply ultrasound to the solution 60 in the reservoir 22. Ultrasound is applied to the solution 60, by which the surface 60a of the solution 60 vibrates, and the mist 62 of the solution 60 is generated in the space 22a above the solution 60.

The heater 30 is located outside the reservoir 22. The heater 30 is configured with an electrically-heated wire extending helically along a peripheral wall of the reservoir 22. The heater 30 heats the peripheral wall of the reservoir 22, by which the solution 60 in the reservoir 22 is heated. The heater 30 is located below the surface 60a of the solution 60 in the reservoir 22. In other words, the heater 30 is not located in a height range equivalent to the space 22a above the solution 60. Accordingly, when the heater 30 heats the reservoir 22, a temperature of the solution 60 easily increases, but a temperature of a portion of an outer wall of the reservoir 22 that is located above the surface 60a (i.e., a portion of the peripheral wall and a top plate of the reservoir 22) does not increase so significantly. This causes the solution 60 to have a higher temperature than an inner surface of the portion of the outer wall of the reservoir 22 located above the surface 60a.

The mist supply device 20 further includes a mist supply path 40, a carrier gas supply path 42, and a diluent gas supply path 44.

An upstream end of the mist supply path 40 is connected to the upper surface of the reservoir 22. A downstream end of the mist supply path 40 is connected to the upstream end 12a of the furnace 12. The mist supply path 40 is configured to supply the mist 62 from the reservoir 22 to the furnace 12.

A downstream end of the carrier gas supply path 42 is connected to an upper portion of the peripheral wall of the reservoir 22. An upstream end of the carrier gas supply path 42 is connected to a carrier gas supply source not shown. The carrier gas supply path 42 is configured to supply carrier gas 64 from the carrier gas supply source to the space 22a in the reservoir 22. The carrier gas 64 is nitrogen gas or another inert gas. The carrier gas 64 that has flowed into the reservoir 22 flows from the reservoir 22 to the mist supply path 40. At this occasion, the mist 62 in the reservoir 22, together with the carrier gas 64, flows to the mist supply path 40.

A downstream end of the diluent gas supply path 44 is connected to a point in the mist supply path 40. An upstream end of the diluent gas supply path 44 is connected to a diluent gas supply source not shown. The diluent gas supply path 44 is configured to supply diluent gas 66 from the diluent gas supply source to the mist supply path 40. The diluent gas 66 is nitrogen gas or another inert gas. The diluent gas 66 that has flowed into the mist supply path 40, together with the mist 62 and the carrier gas 64, flows to the furnace 12. The diluent gas 66 dilutes the mist 62 in the mist supply path 40.

Next, a film formation method using the film formation apparatus 10 will be described. Here, a substrate constituted of a single crystal of n-gallium oxide ($\beta$-$Ga_2O_3$) is used as the substrate 70. Moreover, an aqueous solution in which gallium chloride ($GaCl_3$, $Ga_2Cl_6$) and ammonium fluoride ($NH_4F$) are dissolved is used as the solution 60. Moreover, nitrogen gas is used as the carrier gas 64 and nitrogen gas is used as the diluent gas 66.

Initially, the substrate 70 is placed on the substrate stage 13 in the furnace 12. Next, the substrate 70 is heated by the heater 14. Moreover, the solution 60 stored in the reservoir 22 is heated by the heater 30. The heaters 14, 30 are continuously operated during the film formation process. The ultrasonic transducer 28 is operated when the temperature of the substrate 70 and the temperature of the solution 60 have stabilized, by which the mist 62 of the solution 60 is generated in the space 22a of the reservoir 22. Simultaneously, the carrier gas 64 is introduced from the carrier gas supply path 42 into the reservoir 22, and the diluent gas 66 is introduced from the diluent gas supply path 44 into the mist supply path 40. The carrier gas 64 flows through the reservoir 22, and flows into the mist supply path 40 as shown by an arrow 50. At this occasion, the mist 62 in the reservoir 22, together with the carrier gas 64, flows into the mist supply path 40. Moreover, the diluent gas 66 mixes with the mist 62 in the mist supply path 40. This dilutes the mist 62. The mist 62, together with nitrogen gas (i.e., the carrier gas 64 and the diluent gas 66), flows through the mist supply path 40 toward its downstream side, and flows from the mist supply path 40 into the furnace 12 as shown by an arrow 52. In the furnace 12, the mist 62, together with the nitrogen gas, flows toward the downstream end 12b, and is discharged to the exhaust pipe 80.

A part of the mist 62 flowing through the furnace 12 adheres to the surface of the heated substrate 70. A chemical reaction of the mist 62 (i.e., the solution 60) then occurs on the substrate 70. As a result of which, $\beta$-gallium oxide $\beta$-$Ga_2O_3$) is generated on the substrate 70. The mist 62 is continuously supplied to the surface of the substrate 70, by which a gallium oxide film is grown on the surface of the substrate 70. A single-crystal gallium oxide film is epitaxially grown on the surface of the substrate 70. If the solution 60 contains a raw material of a dopant, the dopant is captured by the gallium oxide film. For example, if the solution 60 contains ammonium fluoride, a gallium oxide film doped with fluorine is formed.

As mentioned above, this film formation apparatus heats the solution 60 in the reservoir 22 by the heater 30 while applying ultrasound to the solution 60 by the ultrasonic transducer 28. Heating the solution 60 while applying ultrasound to the solution 60, as such, enables the mist 62 to be generated highly efficiently from the solution 60. In other words, an amount of the mist 62 generated per unit time increases.

A concentration of the mist to be supplied to the surface of the substrate 70 can be adjusted by flow rates of the carrier gas 64 and the diluent gas 66. However, if the flow rates of the carrier gas 64 and the diluent gas 66 are changed, a flow speed of the mist 62 at the surface of the substrate 70 accordingly changes. The change in flow speed of the mist 62 influences a property of a gallium oxide film to be grown on the surface of the substrate 70. Contrary to this, the film formation apparatus 10 in the first embodiment can control the concentration of the mist to be supplied to the surface of the substrate 70 also by the temperature of the solution 60. In this case, the concentration of the mist to be supplied to the surface of the substrate 70 can be controlled independently of the flow speed of the mist 62 at the surface of the substrate 70. This can control a property of the gallium oxide film to be grown on the surface of the substrate 70, more accurately.

Moreover, since this film formation apparatus heats the solution 60 by the heater 30, the temperature of the solution 60 during the film formation process is stable. In other words, if not heated by the heater 30, the solution 60 is substantially at a room temperature at beginning of the film formation process. In this case, owing to the influence of heat generated by the ultrasonic transducer 28 or at the furnace 12, the temperature of the solution 60 gradually increases during the film formation process. This unintentionally causes, during the film formation process, changes in an efficiency at which the mist 62 is generated, and changes in a growth rate of a gallium oxide film on the surface of the substrate 70. These changes hinder accurate control of the property of a gallium oxide film. Contrary to this, since the film formation apparatus 10 in the first embodiment heats the solution 60 by the heater 30 during the film formation process, the solution 60 is less likely to be influenced by the heat generated at the ultrasonic transducer 28 or at the furnace 12. Since the unintentional changes in the temperature of the solution 60 are less likely to occur during the film formation process, the property of a gallium oxide film to be grown on the surface of the substrate 70 can be controlled more accurately.

Note that the temperature of the solution 60 may be controlled to be substantially constant, or may be changed during the film formation process.

If the temperature of the solution 60 is controlled to be substantially constant during the film formation process, the heater 30 may be feedback-controlled by a controller not shown so as to control the temperature of the solution 60 to be substantially constant, while measuring the temperature of the solution 60 by a sensor. Moreover, the heater 30 may be operated with substantially constant electric power to control the temperature of the solution 60 to be substantially constant. In any of the control methods, the temperature of the solution 60 during the film formation process can be stabilized in comparison with the case where the heater 30 is not used for heating the solution 60. Controlling the temperature of the solution 60 to be substantially constant, as such, enables a homogeneous gallium oxide film to be grown.

The temperature of the solution 60 in the reservoir 22 may be intentionally increased or decreased during the film formation process, by changing the electric power to be supplied to the heater 30 by a controller not shown. For example, if the property of a gallium oxide film to be grown on the surface of the substrate 70 is intentionally changed, the temperature of the solution 60 may be increased or decreased. Moreover, there may be a case where, during the film formation process, water evaporates from the solution 60 in the reservoir 22, by which a viscosity of the solution 60 increases. Such changes in viscosity tend to occur particularly in a case where the solution 60 contains a material of a donor or an acceptor. If the viscosity of the solution 60 increases as such, such an increase in viscosity of the solution 60 may be suppressed by a gradual increase in temperature of the solution 60. The suppression of the increase in viscosity of the solution 60 stabilizes the efficiency at which the mist 62 is generated, and enables a homogeneous gallium oxide film to be grown.

Moreover, a part of the mist 62 generated in the space 22a in the reservoir 22 adheres to the inner surface of the outer wall of the reservoir 22. The solution that has adhered to the inner surface of the outer wall (the solution that constitutes the mist 62) then streams down along the inner surface of the outer wall to the surface 60a of the solution 60 in the reservoir 22. If the portion of the inner surface of the outer wall that is located above the surface 60a has a high temperature, water evaporates from the solution while the solution is streaming down along the inner surface, thereby causing an increase in concentration of the solution. If such a solution streams down to the surface 60a, the concentration of the stored solution 60 increases. In other words, the concentration of the solution 60 might change during the film formation process, and the property of a gallium oxide film to be grown on the surface of the substrate 70 might change unintentionally. Contrary to this, in the above-mentioned film formation apparatus 10, the heater 30 is located only at a position below the surface 60a. Therefore, the portion of the inner surface of the outer wall located above the surface 60a has a lower temperature than the stored solution 60. Accordingly, even when the mist 62 in the space 22a adheres to the inner surface of the outer wall, water is less likely to evaporate from the solution adhering to the inner surface of the outer wall (the solution that constitutes the mist 62). This changes the concentration of the solution 60 in the reservoir 22 less easily. Therefore, unintentional changes in the property of a gallium oxide film to be grown on the surface of the substrate 70 can be suppressed.

Moreover, if the carrier gas 64 has a high temperature, water evaporates from the mist 62 existing in the space 22a (i.e., the mist 62 floating in the carrier gas 64), thereby causing a change in concentration of the solution that constitutes the mist 62. Contrary to this, in the above-mentioned film formation apparatus 10, the heater 30 is located only at the position below the surface 60a. Accordingly, during the film formation process, the carrier gas 64 in the reservoir 22 has a lower temperature than the solution 60 stored in the reservoir 22. This suppresses evaporation of water from the mist 62. Therefore, the property of a gallium oxide film to be grown on the surface of the substrate 70 can be controlled accurately.

The temperature of the portion of the inner surface of the outer wall located above the surface 60a, and the temperature of the carrier gas 64 in the space 22a may each be stabilized at a low temperature, by provision of a cooling mechanism configured to cool the portion of the outer wall above the surface 60a (e.g., a cooling mechanism with use of cooling water).

Second Embodiment

Figure 2:
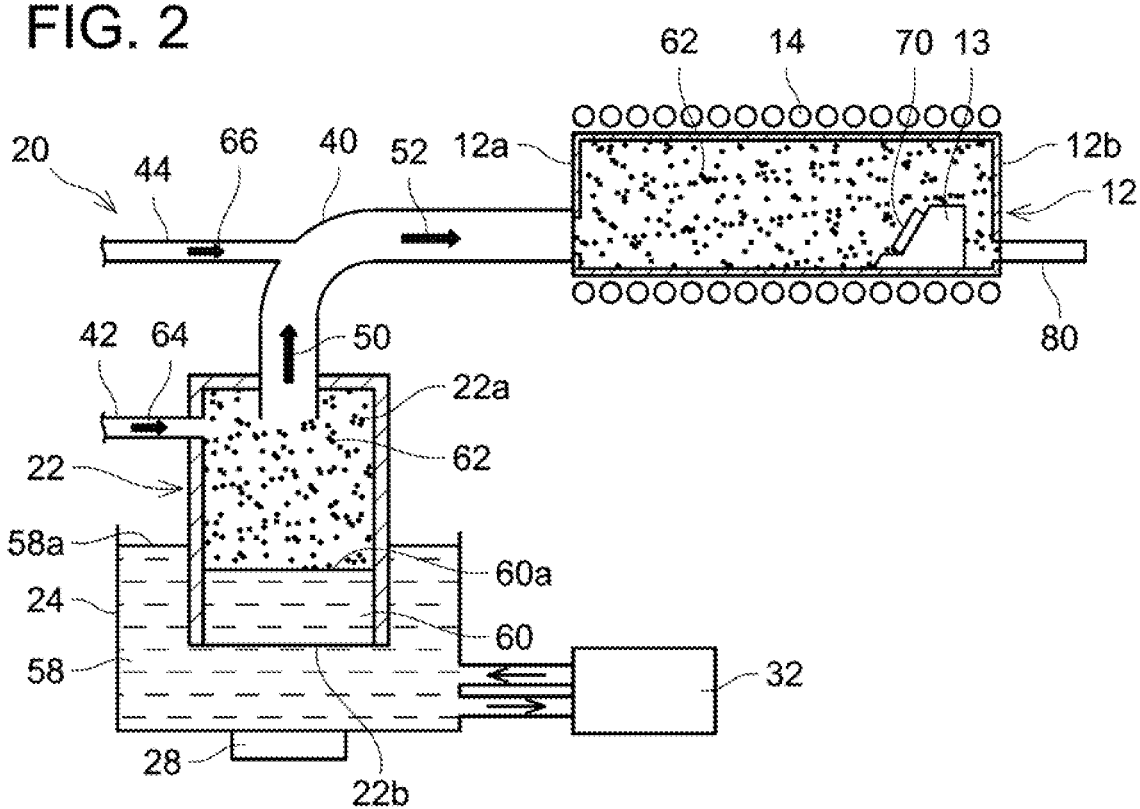
FIG. 2 is a configuration diagram of a film formation apparatus in a second embodiment.

A film formation apparatus in a second embodiment, shown in FIG. 2, differs from the film formation apparatus 10 in the first embodiment about a structure of the mist supply device 20. In the film formation apparatus in the second embodiment, a mist supply device 20 includes a water tank 24 and a circulation heater 32. The water tank 24 is a container a top of which is opened, and stores water 58 therein. In the second embodiment, the ultrasonic transducer 28 is installed at a bottom surface of the water tank 24, and applies ultrasonic vibration to the water 58 in the water tank 24. The reservoir 22 has its bottom portion immersed in the water 58 in the water tank 24. A surface 58a of the water 58 stored in the water tank 24 is located above the surface 60a of the solution 60 stored in the reservoir 22. A film constitutes a bottom surface 22b of the reservoir 22. This facilitates transfer of ultrasound from the water 58 in the water tank 24 to the solution 60 in the reservoir 22. Application by the ultrasonic transducer 28 of ultrasonic vibration to the water 58 in the water tank 24 transfers the ultrasonic vibration to the solution 60 via the water 58. The surface 60a of the solution 60 then vibrates, thereby generating the mist 62 of the solution 60 in the space 22a above the solution 60. The circulation heater 32 is configured to heat the water 58 in the water tank 24 while circulating the water 58. The solution 60 in the reservoir 22 is heated by the water 58 in the water tank 24. Since the surface 58a of the water 58 is located above the surface 60a of the solution 60, the water 58 can heat an entirety of the solution 60. This can suppress nonuniformity in temperature within the solution 60. Other configurations of the film formation apparatus in the second embodiment are equal to those of the film formation apparatus 10 in the first embodiment.

The film formation apparatus in the second embodiment heats the water 58 by the circulation heater 32 while applying ultrasound to the water 58 by the ultrasonic transducer 28 during the film formation process. The water 58 is maintained at a high temperature at all times during the film formation process. Heat transfers from the heated water 58 to the solution 60, by which the solution 60 is heated. Moreover, ultrasound transfers from the ultrasonic transducer 28 to the solution 60 via the water 58. Ultrasound is thus applied to the heated solution 60. This enables the mist 62 to be generated highly efficiently in the space 22a in the reservoir 22.

Third Embodiment

Figure 3:
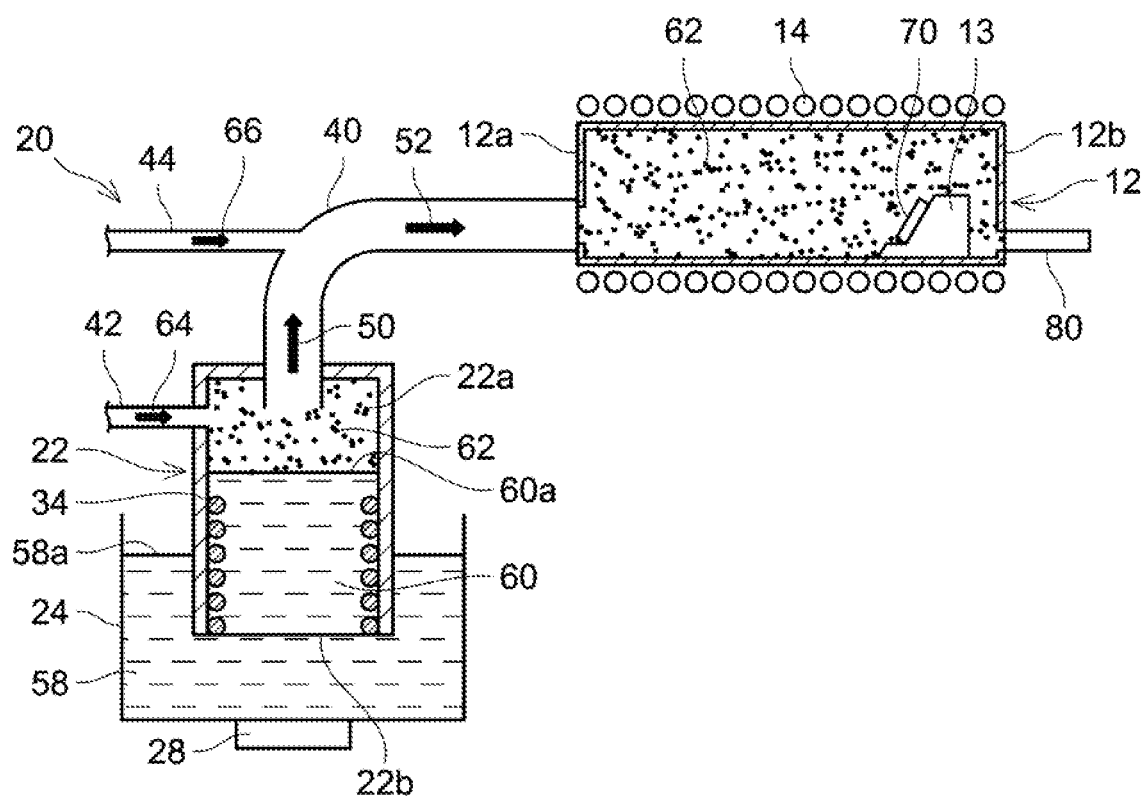
FIG. 3 is a configuration diagram of a film formation apparatus in a third embodiment.

A film formation apparatus in a third embodiment, shown in FIG. 3, differs from the film formation apparatus in the second embodiment in that the film formation apparatus in the third embodiment comprises a heater 34 using electrically heated wire in place of the circulation heater 32. Other configurations of the third embodiment are identical with those of the film formation apparatus in the second embodiment. The heater 34 is configured with an electrically-heated wire located in the reservoir 22 and helically extending along a peripheral wall of the reservoir 22. The heater 34 is in direct contact with the solution 60 in the reservoir 22. The heater 34 is located below the water surface 60a of the solution 60. The heater 34 is placed avoiding a central portion of the bottom surface 22b of the reservoir 22. This facilitates transfer of ultrasound from the ultrasonic transducer 28 to the solution 60.

The film formation apparatus in the third embodiment heats the solution 60 by the heater 34 while applying ultrasound to the water 58 by the ultrasonic transducer 28 during the film formation process. Ultrasound transfers from the ultrasonic transducer 28 to the solution 60 via the water 58. Ultrasound is thus applied to the heated solution 60. This can generate the mist 62 highly efficiently in the space 22a in the reservoir 22. Moreover, since in the third embodiment the solution 60 can be heated directly by the heater 34, the solution 60 can be heated more quickly.

The temperature controlling method for the solution 60 described in the first embodiment may also be used in the film formation apparatuses in each of the second and third embodiments.

Some of the features characteristic disclosed in the present description will herein be listed. It should be noted that the respective technical elements are independently useful.

In an example of a film formation apparatus disclosed herein, during epitaxially growing the film, the solution in the reservoir may be controlled to have a higher temperature than a portion of an inner surface of an outer wall of the reservoir, the portion of the inner surface being located above a surface of the solution in the reservoir.

A part of the mist generated in the reservoir adheres to the portion of the inner surface of the outer wall of the reservoir that is located above the surface of the solution. The solution that has adhered to the inner surface streams down to the surface of the stored solution. If the portion of the inner surface of the outer wall of the reservoir located above the surface of the stored solution has a high temperature, water evaporates from the solution adhering to the inner surface, thereby causing an increase in concentration of the solution adhering to the inner surface. If the solution having an increased concentration as such streams down to the surface of the stored solution, the concentration of the stored solution increases. Contrary to this, in the above-described film formation apparatus, the portion of the inner surface of the outer wall of the reservoir located above the surface of the solution in the reservoir is controlled to have a relatively low temperature, by which the concentration of the stored solution is less likely to increase. Therefore, properties of a film to be epitaxially grown can be controlled more accurately.

An example of a film formation apparatus disclosed herein may further comprise a carrier gas supply path configured to supply carrier gas to the reservoir. In this case, during epitaxially growing the film, the solution in the reservoir may be controlled to have a higher temperature than the carrier gas in the reservoir.

This configuration can reduce evaporation of water from the mist generated in the reservoir, and reduce changes in concentration of the solution that constitutes the mist. Properties of a film to be epitaxially grown can thereby be controlled more accurately.

In an example of a film formation apparatus disclosed herein, the heater may be located below a surface of the solution in the reservoir.

This configuration can heat the solution while suppressing an increase in temperature of a portion of an outer wall of the reservoir, the portion of the outer wall being located above the surface of the solution.

In an example of a film formation apparatus disclosed herein, a temperature of the solution in the reservoir may be increased or decreased during epitaxially growing the film.

This configuration can allow to control the concentration of the mist to be supplied to the furnace in the process of epitaxially growing the film.

While specific examples of the present disclosure have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present disclosure is not limited to the combinations described at the time the claims are filed. Further, the purpose of the examples illustrated by the present description or drawings is to satisfy multiple objectives simultaneously, and satisfying any one of those objectives gives technical utility to the present disclosure.

What is claimed is:

1. A film formation apparatus configured to supply mist of a solution to a surface of a substrate so as to epitaxially grow a film on the surface of the substrate, the film formation apparatus comprising:
   a furnace configured to house and heat the substrate;
   a reservoir configured to store the solution;
   a heater configured to heat the solution in the reservoir;
   an ultrasonic transducer configured to apply ultrasound to the solution in the reservoir so as to generate the mist of the solution in the reservoir; and
   a mist supply path configured to carry the mist from the reservoir to the furnace,
   wherein during epitaxially growing the film, the solution in the reservoir is controlled to have a higher temperature than a portion of an inner surface of an outer wall of the reservoir, the portion of the inner surface being located above a surface of the solution in the reservoir.

2. A film formation apparatus configured to supply mist of a solution to a surface of a substrate so as to epitaxially grow a film on the surface of the substrate, the film formation apparatus comprising:
   a furnace configured to house and heat the substrate;
   a reservoir configured to store the solution;
   a heater configured to heat the solution in the reservoir;
   an ultrasonic transducer configured to apply ultrasound to the solution in the reservoir so as to generate the mist of the solution in the reservoir;
   a mist supply path configured to carry the mist from the reservoir to the furnace; and
   a carrier gas supply path configured to supply carrier gas to the reservoir,
   wherein, during epitaxially growing the film, the solution in the reservoir is controlled to have a higher temperature than the carrier gas in the reservoir.

3. The film formation apparatus of claim 2, wherein the heater is located below a surface of the solution in the reservoir.

4. The film formation apparatus of claim 2, wherein a temperature of the solution in the reservoir is increased or decreased during epitaxially growing the film.

5. The film formation apparatus of claim 1, wherein the heater is located below a surface of the solution in the reservoir.

6. The film formation apparatus of claim 1, wherein a temperature of the solution in the reservoir is increased or decreased during epitaxially growing the film.

7. A method of manufacturing a semiconductor device using a film formation apparatus which comprises:
   a furnace configured to house and heat a substrate;
   a reservoir configured to store a solution;
   a heater configured to heat the solution in the reservoir;
   an ultrasonic transducer configured to apply ultrasound to the solution in the reservoir so as to generate mist of the solution in the reservoir; and
   a mist supply path configured to carry the mist from the reservoir to the furnace,
   the method comprising:
   heating the solution in the reservoir by the heater while applying the ultrasound to the solution in the reservoir by the ultrasonic transducer so as to generate the mist in the reservoir and supply the mist generated in the reservoir to a surface of the substrate housed in the furnace such that a film is epitaxially grown on the surface of the substrate.

8. A method of claim 7, wherein during epitaxially growing the film, the solution in the reservoir is controlled to have a higher temperature than a portion of an inner surface of an outer wall of the reservoir, the portion of the inner surface being located above a surface of the solution in the reservoir.

9. The method of claim 7, wherein the film formation apparatus further comprises a carrier gas supply path configured to supply carrier gas to the reservoir, and
   during epitaxially growing the film, the solution in the reservoir is controlled to have a higher temperature than the carrier gas in the reservoir.

* * * * *